United States Patent
Doerner et al.

(10) Patent No.: US 11,079,970 B2
(45) Date of Patent: Aug. 3, 2021

(54) STORAGE ARRAY SUPPORTING MULTI-THREAD ACCESS

(71) Applicant: Quantum Corporation, San Jose, CA (US)

(72) Inventors: Don Doerner, San Jose, CA (US); Marc A. Smith, San Jose, CA (US); Matthew C. Dewey, Broomfield, CO (US)

(73) Assignee: Quantum Corporation, San Jose, CA (US)

( * ) Notice: Subject to any disclaimer, the term of this patent is extended or adjusted under 35 U.S.C. 154(b) by 0 days.

(21) Appl. No.: 16/817,851

(22) Filed: Mar. 13, 2020

(65) Prior Publication Data
US 2020/0333983 A1    Oct. 22, 2020

Related U.S. Application Data

(60) Provisional application No. 62/836,865, filed on Apr. 22, 2019.

(51) Int. Cl.
| | |
|---|---|
| *G06F 3/06* | (2006.01) |
| *G06F 11/10* | (2006.01) |
| *H03M 13/29* | (2006.01) |
| *H03M 13/15* | (2006.01) |
| *G06F 9/48* | (2006.01) |

(52) U.S. Cl.
CPC .......... *G06F 3/0659* (2013.01); *G06F 3/0604* (2013.01); *G06F 3/0644* (2013.01); *G06F 3/0673* (2013.01); *G06F 9/4881* (2013.01); *G06F 11/1076* (2013.01); *H03M 13/154* (2013.01); *H03M 13/2906* (2013.01)

(58) Field of Classification Search
CPC .... G06F 3/0659; G06F 3/0604; G06F 3/0644; G06F 3/0673; G06F 9/4881; G06F 11/1076; H03M 13/154; H03M 13/2906
See application file for complete search history.

(56) References Cited

U.S. PATENT DOCUMENTS

| | | | | |
|---|---|---|---|---|
| 8,627,331 | B1 * | 1/2014 | Grunwald | ........... H04L 67/1087 718/106 |
| 2009/0222596 | A1 * | 9/2009 | Flynn | .................... G06F 3/0643 710/22 |

(Continued)

*Primary Examiner* — Kyle Vallecillo
(74) *Attorney, Agent, or Firm* — Eschweiler & Potashnik, LLC

(57) ABSTRACT

Systems, methods, and circuitries are provided for supporting multiple concurrent thread access to a storage array. In one example, a storage array includes a plurality of storage devices each divided into at least N subdivisions. A volume includes a set of subdivisions including a subdivision in each of M different storage devices. Memory management circuitry receives first data and second data for storing in the storage array and selects a first volume for storing the first data and a second volume for storing the second data. The second volume includes a different set of subdivisions than the first volume. The processor uses a first set of processor threads to process and store the first data in the first volume and uses a second set of processor threads to, concurrent with the processing and storing of the first data, process and store the second data in the second volume.

20 Claims, 3 Drawing Sheets

(56) References Cited

U.S. PATENT DOCUMENTS

| | | | |
|---|---|---|---|
| 2013/0173956 A1* | 7/2013 | Anderson | G06F 12/06 |
| | | | 714/6.24 |
| 2013/0173996 A1* | 7/2013 | Anderson | H04L 1/0043 |
| | | | 714/770 |
| 2016/0246742 A1* | 8/2016 | Kimmel | G06F 3/061 |
| 2017/0185304 A1* | 6/2017 | Curtis-Maury | G06F 3/0644 |
| 2017/0185338 A1* | 6/2017 | Kumar K. M. | G06F 3/0631 |
| 2017/0293532 A1* | 10/2017 | Prahlad | G06F 3/0673 |
| 2019/0087111 A1* | 3/2019 | Lingarajappa | G06F 3/0619 |
| 2019/0369874 A1* | 12/2019 | Barrell | G06F 16/903 |
| 2020/0019323 A1* | 1/2020 | Zagade | G06F 3/061 |
| 2020/0125444 A1* | 4/2020 | Swamy | G06F 12/10 |

* cited by examiner

STORAGE ARRAY SUPPORTING MULTI-THREAD ACCESS

CROSS REFERENCE TO RELATED APPLICATIONS

This application claims priority to U.S. Provisional Patent Application No. 62/836,865 filed on Apr. 22, 2019, entitled "BLOCK STORAGE DEVICE," which is incorporated herein by reference for all purposes.

BACKGROUND

Storage arrays include a set of storage devices managed by a central management system. Storage arrays provide many benefits including scalability, low-latency access to stored data, and redundancy/error coding for data durability.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
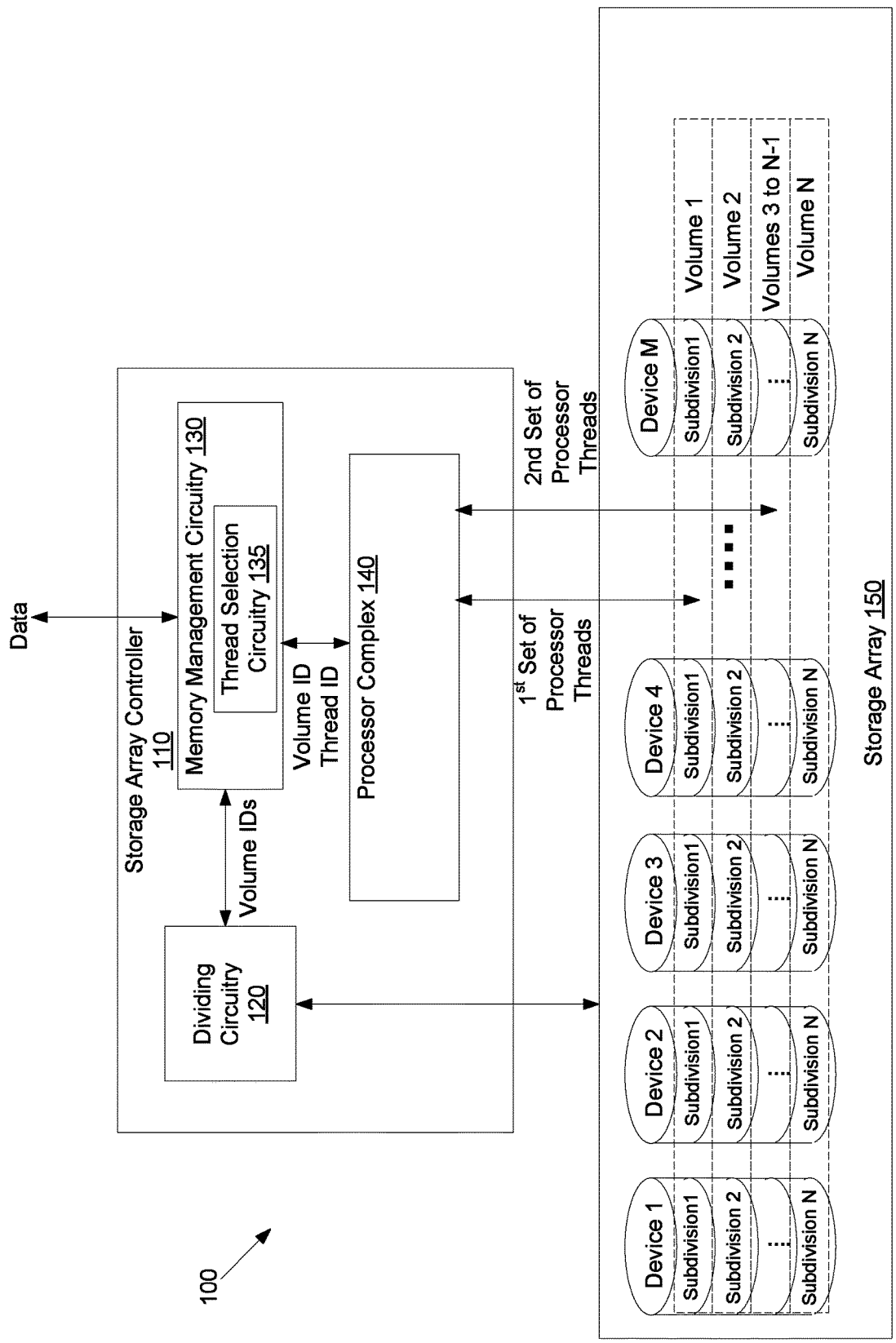
FIG. 1 illustrates an example storage array in accordance with various aspects described.

In the broadest sense, storage arrays are systems that allow a plurality of storage devices to be treated as a single unit of storage. Examples of storage devices that are used in storage arrays include spinning hard disk drives (HDDs) and solid-state drives (SSDs). The storage devices in a storage array may all be of the same type or may be of different types to support different usage cases for different data. The storage devices in a storage array system are controlled by a storage array controller that can access the data stored across the multiple drives.

Storage arrays may have built-in redundancy features that support data recovery in the event that one or more of the storage devices fails. Storage array systems may generate and/or store erasure coding data that can be used to reconstruct data stored on a failed drive. Examples of erasure coding include XOR, P/Q parity, Reed-Solomon, and so on.

One example storage array system architecture is a redundant array of independent/inexpensive disks (RAID). In a RAID storage array, data is distributed across multiple disks or drives to provide redundancy and/or improved performance. There are multiple "levels" of RAID storage schemes. Higher level RAID storage arrays (e.g., level 5 or 6) provide for data recovery in the event of one (level 5) or two (level 6) drive failures. In these RAID levels, data is separated into blocks and different blocks are stored in different "stripes" of the drives. Erasure coding data is generated for the data and also distributed across the drives.

Some modern storage array systems utilize a non-volatile memory express (NVMe) controller interface to provide high-speed transfer of data to SSDs over a high-speed Peripheral Component Interconnect Express (PCIe) bus. These NVMe systems are expected to provide very high performance, approximating the performance of the product of a single NVMe device and the number of NVMe devices in the storage array. Moreover, data durability is expected, for example the failure of a single storage device should not cause data loss. Finally, NVMe based systems are typically more expensive than HDD based storage array systems.

For the purposes of this description, an NVMe based RAID storage array system is sometimes used to provide context for various features. However, it is to be understood that the storage device division techniques described herein, which support storage array access by multiple concurrent sets of processor threads, may be used to improve the performance of any storage system in which a collection of storage devices are connected and managed as a single storage device. Some aspects of the described storage device division techniques may have particular applicability to storage array systems that include storage devices that do not depend on mechanical motion (e.g., SSDs). In a broader sense, the storage device division techniques described herein are applicable to any storage device or media that suffers little or no penalty for random access.

FIG. 1 illustrates an exemplary storage array system 100 that includes a storage array controller 110 and a storage array 150 of multiple storage devices 1-M. To support concurrent processor threads, "volumes" are created that include a subdivision (e.g., a partition, a portion, a range of memory addresses, and so on) of a plurality of the storage devices. Each volume can be accessed by a set of processor threads and multiple volumes can be accessed concurrently by multiple sets of processor threads.

The storage array controller 110 includes dividing circuitry 120, memory management circuitry 130, and at least one processor complex 140. In one example, the processor complex 140 includes at least one processor, with each processor providing multiple cores. Each core is capable of providing multiple threads of execution (hereinafter "processor threads"). In one particular example, the processor complex 140 includes two processors, each with 18 cores, where each core can run two concurrent processor threads. In this example, there are potentially 2×18×2 concurrent processor threads available in the storage array controller 110. One example of a processor thread is a "hyper-thread" provided by some Intel® processors. In hyper-threading for each processor core that is physically present the operating system addresses two logical cores and shares the workload between them when possible. Of course, other types and arrangements of concurrent processor threads may be used in the described storage device division scheme.

The dividing circuitry 120 is configured to divide the storage devices in the storage array 150 into subdivisions to create sets of subdivisions across the storage devices that are treated as volumes by the controller 110. The dividing circuitry 120 is illustrated as included within the storage array controller 110, however, in some examples, the dividing circuitry 120 may be external to the controller 110 and used during an initial configuring of the storage array system 100. The storage devices are divided into N subdivisions. In the illustrated example, each storage device is divided into the same number of subdivisions, however, in other examples, the number of subdivisions per storage device may vary. In one example, a size (amount of storage space) of each subdivision is uniform for all subdivisions, however in other examples, the size of subdivisions may vary. In the illustrated example, the size of each subdivision in a volume is the same, however in other examples, the size of subdivisions in a volume may vary.

In general, the process of storing data in an array includes managing the I/O operations (allocating data to the storage devices), calculating erasure coding data, and storing the data and erasure coding data (i.e., protected data) in the storage devices of the storage array 150. In one example, a single processor thread may perform the data allocation, 2-4 processor threads may calculate the erasure coding data, and another processor thread may store the protected data in the storage devices. Thus, only 4-6 processor threads are used to handle a data storage operation. By creating volumes that include subdivisions in different storage devices, additional sets of concurrent threads may be used to handle a different data storage operation.

The memory management circuitry 130 receives a first request to write "first" data and selects a volume for storing the incoming data. Thread selection circuitry 135 assigns a set of processor threads to access the volume that will store the incoming data. While the first data is being written, the memory management circuitry 130 may receive a second request to write "second" data and may select a different volume for storing the second data. Thread selection circuitry 135 may assign a different set of processor threads to access the different volume that stores the second data. In this manner different volumes may be accessed concurrently (e.g., simultaneously or otherwise at least partially overlapping in time) using different sets of processor threads to concurrently store the first and second data. In some instances, the memory management circuitry 130 may select the same volume for storing both the first and second data. In this case the same set of processor threads (that have been selected for the volume) may perform the storing of the first and second data.

In one example, the thread selection circuitry 135 statically assigns a set of processor threads to each volume, such that the same set of processor threads will process any data associated with a given volume. In other examples, the thread selection circuitry 135 may dynamically assign a set of processor threads to each incoming request to read/write data in a volume based on a present operating condition (e.g., workload) of the storage array system 100. In one example, the thread selection circuitry 135 ensures that only one set of processor threads is assigned to any volume at any given time. In one example, the thread selection circuitry 135 may use or leverage scheduling features of an operating system of the controller 110 to dynamically assign a set of processor threads to a request.

In one particular example, the storage array system 100 is a NVMe RAID-5 system having 24 NVMe storage devices (e.g., M=24). The storage devices are divided into 4 groups of 6, with each group using 5+1 RAID-5 (simple parity). Within each group, each of the six NVMe storage devices is divided into four (e.g., N=4) NVMe namespaces (e.g., subdivisions). The first namespace in each device are considered as a first volume, the second namespace in each device are considered as a second volume, and so on. Each volume forms a RAID-5 set with a namespace or subdivision on each of six storage devices.

When the memory management circuitry 130 receives a request to read data stored in a particular volume, the thread selection circuitry 135 will assign processor threads already assigned to that volume for performing the read operation. If no processor threads are currently assigned to the volume, the thread selection circuitry 135 will select a set of processor threads and assign the selected set of processor threads to the volume.

Figure 2:
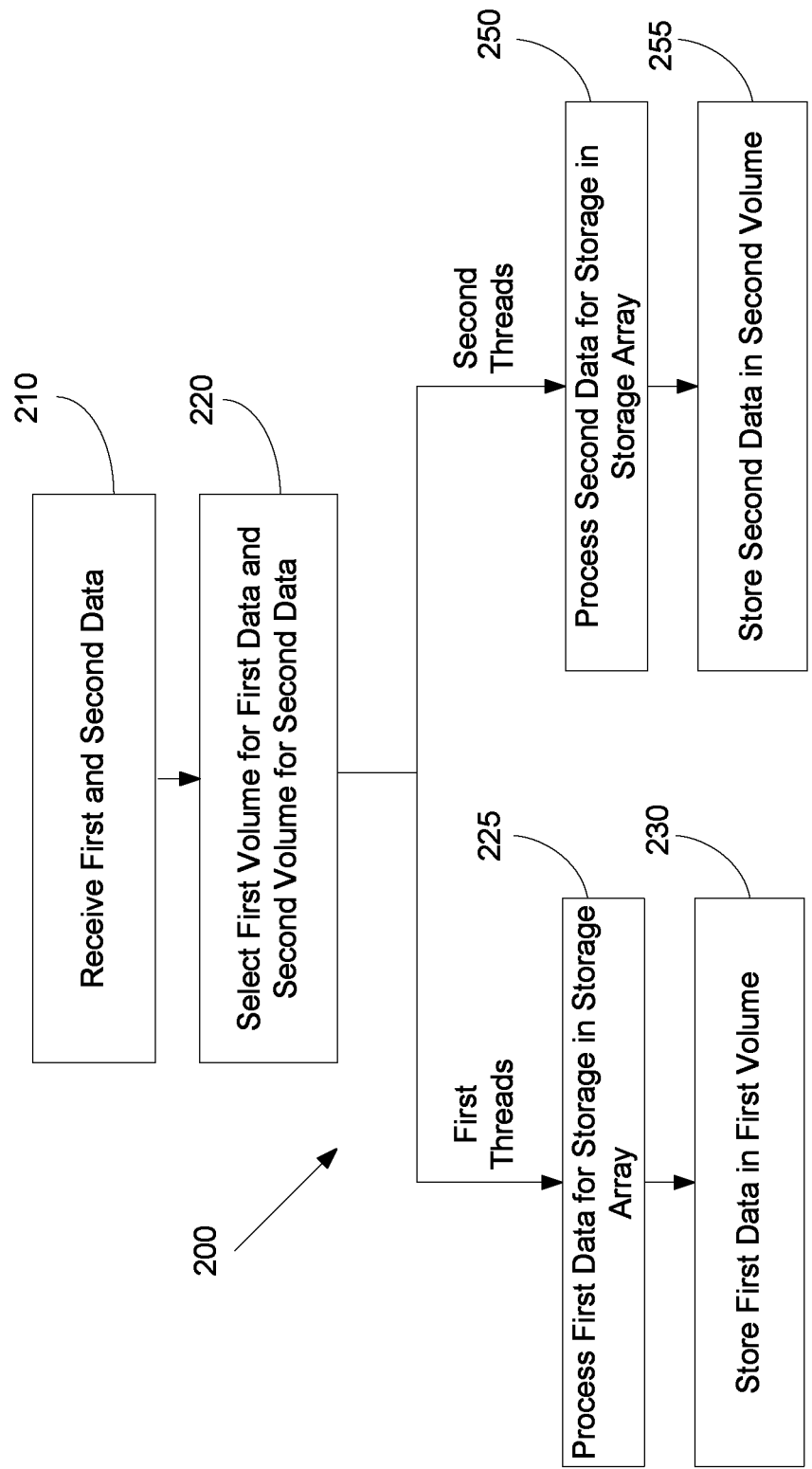
FIG. 2 illustrates an example method for storing data in a storage array using multiple sets of processor threads in accordance with various aspects described.

Turning now to FIG. 2, an example method 200 is illustrated for storing data in a storage array that includes a plurality of storage devices, wherein each storage device has been divided into at least N subdivisions (e.g., namespaces). The method 200 may be performed, for example by the storage system 100 of FIG. 1. The method includes, at 210, receiving first data and second data for storing in a storage array. At 220 a first volume is selected for storing the first data. A volume includes a set of subdivisions including a subdivision in each of M different storage devices in the plurality of storage devices. A second volume for storing the second data is also selected at 220. The second volume includes a different set of subdivisions than the first volume. At 225-230, the method includes, with a first set of processor threads, processing the first data for storage in the storage array; and storing the first data in the first volume. At 250-255 the method includes, with a second set of processor threads different from the first set of processor threads, and concurrent with the processing and storing of the first data, processing the second data for storage in the storage array; and storing the second data in the second volume.

Figure 3:
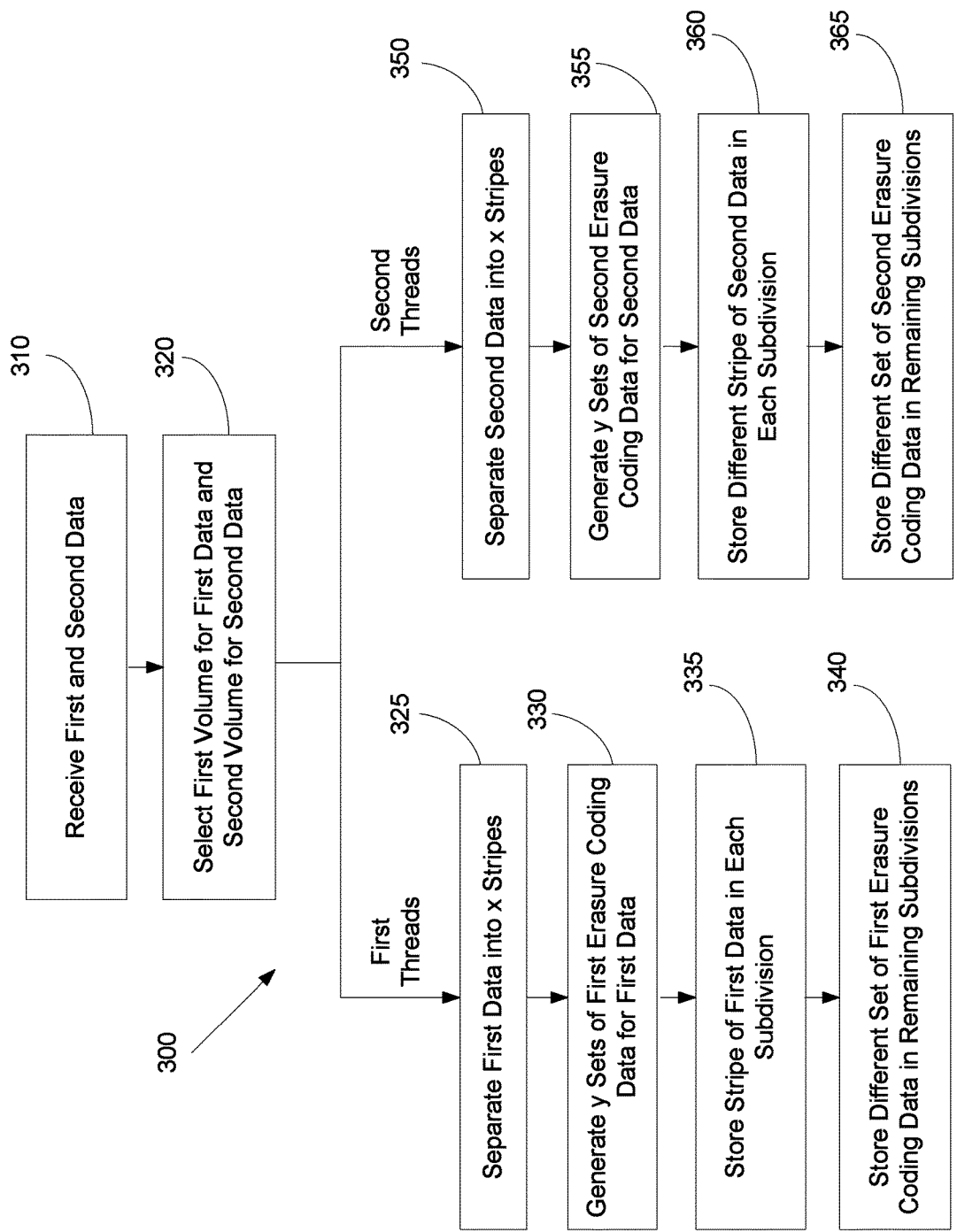
FIG. 3 illustrates an example method for storing data in an NVMe storage array using multiple sets of processor threads in accordance with various aspects described.

Turning to FIG. 3, an example method 300 is illustrated for storing data in a storage array that includes a plurality of storage devices, wherein each storage device has been divided into at least N subdivisions (e.g., namespaces). The method 300 may be performed, for example by the storage system 100 of FIG. 1 implemented with NVMe storage devices arranged in a RAID-5 architecture. The method includes, at 310, receiving first data and second data for storing in a storage array. At 320 a first volume is selected for storing the first data. A volume includes a set of subdivisions (e.g., namespaces) including a subdivision in each of M different storage devices in the plurality of storage devices. A second volume for storing the second data is also selected at 320. The second volume includes a different set of subdivisions than the first volume.

The following operations are performed by a first set of processor threads. At 325 the first data is separated into x stripes and at 330, y sets of first erasure coding data are generated for the first data, wherein x+y=M. The method includes, at 335, storing a stripe of the first data in each of M-x subdivisions in the first volume; and, at 340, storing a set of first erasure coding data in each of the remaining subdivisions in the first volume.

The following operations are performed by a second set of processor threads. At 350 the second data is separated into x stripes and at 355, y sets of second erasure coding data are generated for second data, wherein x+y=M. The method includes, at 360, storing a stripe of the second data in each of M-x subdivisions in the second volume; and, at 365, storing a set second erasure coding data in each of the remaining subdivisions in the second volume.

It can be seen from the foregoing description that by creating multiple volumes from sets of subdivisions on storage devices in a storage array, multiple concurrent thread access to the storage array can be supported.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for implementing a storage array according to embodiments and examples described herein.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. A method, comprising:
   receiving first data and second data for storing in a storage array, wherein the storage array comprises a plurality of storage devices, further wherein each storage device has been divided into at least N subdivisions;
   selecting a first volume for storing the first data, wherein a volume comprises a set of subdivisions including a subdivision in each of M different storage devices in the plurality of storage devices;
   selecting a second volume for storing the second data, wherein the second volume comprises a different set of subdivisions than the first volume;
   with a first set of processor threads:
      processing the first data for storage in the storage array; and
      storing the first data in the first volume;
   with a second set of processor threads different from the first set of processor threads:

concurrent with the processing and storing of the first data, processing the second data for storage in the storage array; and
storing the second data in the second volume.

2. The method of claim 1, wherein each subdivision comprises a namespace.

3. The method of claim 1, wherein each subdivision in each volume comprises a same amount of memory.

4. The method of claim 3, wherein each subdivision on each storage device comprises a same amount of memory.

5. The method of claim 1, further comprising:
selecting a third set of processor threads in response to receiving a request to access the first data; and
using the third set of processor threads to access the first data.

6. The method of claim 5, comprising selecting the first set of processor threads as the third set of processor threads, such that the first set of processor threads is statically assigned for access the first data.

7. The method of claim 5, comprising selecting the third set of processor threads based on a current operating condition of the storage array.

8. The method of claim 1, comprising:
processing the first data to generate first erasure coding data;
storing the first erasure coding data in the first volume;
processing the second data to generate second erasure coding data; and
storing the second erasure coding data in the second volume.

9. The method of claim 8, wherein the first erasure coding data and the second erasure coding data comprises XOR erasure coding data.

10. The method of claim 8, wherein the first erasure coding data and the second erasure coding data comprises P/Q parity erasure coding data.

11. The method of claim 8 wherein the first erasure coding data and the second erasure coding data comprises Reed-Solomon erasure coding data.

12. The method of claim 1, comprising:
with the first set of processor threads:
separating the first data into x stripes;
generating y sets of first erasure coding data for the first data, wherein x+y=M;
storing a stripe of the first data in each of M-x subdivisions in the first volume; and
storing a set of first erasure coding data in each of the remaining subdivisions in the first volume; and
with the second set of processor threads:
separating the second data into x stripes;
generating y sets of second erasure coding data for the second data;
storing a stripe of the second data in each of M-x subdivisions in the second volume; and
storing a set of second erasure coding data in each of the remaining subdivisions in the second volume.

13. A storage array system, comprising:
a storage array comprising a plurality of storage devices each divided into at least N subdivisions such that the storage array comprises a plurality of volumes, wherein a volume comprises a set of subdivisions including a subdivision in each of M different storage devices in the plurality of storage devices;
a storage array controller comprising:
memory management circuitry configured to:
receive first data and second data for storing in the storage array; and
select a first volume for storing the first data; and
select a second volume for storing the second data, wherein the second volume comprises a different set of subdivisions than the first volume; and
at least one processor configured to:
use a first set of processor threads to process the first data and store the first data in the first volume; and
concurrent with the processing and storing of the first data, use a second set of processor threads to process the second data and store the second data in the second volume.

14. The storage array system of claim 13, further comprising dividing circuitry configured to subdivision the storage devices into at least N namespaces, wherein each namespace corresponds to a subdivision.

15. The storage array system of claim 13, wherein the first set of processor threads and the second set of processor threads are executed by a same processor core.

16. The storage array system of claim 13, wherein the first set of processor threads and the second set of processor threads are hyper-threads.

17. The storage array system of claim 13, wherein the at least one processor is configured to:
use the first set of processor threads to:
separate the first data into x stripes;
generate y sets of first erasure coding data for the first data, wherein x+y=M;
store a stripe of the first data in each of M-x subdivisions in the first volume; and
store a set of first erasure coding data in each of the remaining subdivisions in the first volume; and
use the second set of processor threads to:
separate the second data into x stripes;
generate y sets of second erasure coding data for the second data;
store a stripe of the second data in each of M-x subdivisions in the second volume; and
store a set of second erasure coding data in each of the remaining subdivisions in the second volume.

18. The storage array system of claim 13, further comprising thread selection circuitry configured to:
receive a request to access the first data; and
select a set of processor threads to access the first volume based on a present operating condition of the storage array system.

19. The storage array system of claim 13, further comprising thread selection circuitry configured to:
statically assign the first set of processor threads to the first volume;
receive a request to access the first data; and
select the first set of processor threads to access the first volume.

20. The storage array system of claim 13, wherein the at least one processor is configured to:
use the first set of processor threads to process the first data to generate first erasure coding data store the first erasure coding data in the first volume; and
use the second set of processor threads to process the second data to generate second erasure coding data and store the second erasure coding data in the second volume.

* * * * *